United States Patent
Kim

(10) Patent No.: US 11,562,802 B2
(45) Date of Patent: Jan. 24, 2023

(54) TEST CIRCUIT, SEMICONDUCTOR DEVICE AND TEST SYSTEM INCLUDING THE TEST CIRCUIT

(71) Applicant: SK hynix Inc., Icheon-si (KR)

(72) Inventor: Dong Wook Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 287 days.

(21) Appl. No.: 16/838,658

(22) Filed: Apr. 2, 2020

(65) Prior Publication Data

US 2021/0065832 A1    Mar. 4, 2021

(30) Foreign Application Priority Data

Aug. 26, 2019  (KR) .................. 10-2019-0104610

(51) Int. Cl.
| | | |
|---|---|---|
| *G11C 29/00* | (2006.01) | |
| *G11C 29/38* | (2006.01) | |
| *G11C 7/22* | (2006.01) | |
| *G11C 7/10* | (2006.01) | |

(52) U.S. Cl.
CPC ............ *G11C 29/38* (2013.01); *G11C 7/1069* (2013.01); *G11C 7/1096* (2013.01); *G11C 7/22* (2013.01)

(58) Field of Classification Search
CPC ..... G11C 29/38; G11C 7/1069; G11C 7/1096; G11C 7/22; G11C 29/56008; G11C 29/56; G11C 59/50; G11C 29/18; G11C 2029/5602
See application file for complete search history.

(56) References Cited

U.S. PATENT DOCUMENTS

| | | | | |
|---|---|---|---|---|
| 4,974,226 A | * | 11/1990 | Fujimori | ......... G01R 31/31917 714/736 |
| 5,173,906 A | * | 12/1992 | Dreibelbis | .............. G06F 11/27 714/E11.169 |
| 6,275,963 B1 | * | 8/2001 | Maeno | ................... G11C 29/32 714/733 |
| 6,442,724 B1 | * | 8/2002 | Augarten | ......... G11C 29/56008 714/738 |
| 10,224,114 B2 | | 3/2019 | Ryu et al. | |
| 2001/0015927 A1 | * | 8/2001 | Ooishi | ................. G11C 7/1087 365/201 |
| 2004/0246337 A1 | * | 12/2004 | Hasegawa | ...... G01R 31/318536 348/189 |
| 2007/0208969 A1 | * | 9/2007 | Fujisaki | ................. G11C 29/56 714/718 |

(Continued)

FOREIGN PATENT DOCUMENTS

KR    1020070066185 A    6/2007

*Primary Examiner* — Albert Decady
*Assistant Examiner* — Enamul M Kabir
(74) *Attorney, Agent, or Firm* — William Park & Associates Ltd.

(57) ABSTRACT

A test circuit includes a comparator and a comparison control circuit. The comparator is configured to compare a first input signal with a second input signal to generate a comparison result signal. The comparison control circuit is configured to perform at least one of an operation for latching the comparison result signal as reference data and an operation for outputting the comparison result signal as a first output signal. The comparison control circuit is configured to provide expectation data as the first input signal and read data as the second input signal in accordance with the reference data.

15 Claims, 4 Drawing Sheets

(56) References Cited

U.S. PATENT DOCUMENTS

| | | | |
|---|---|---|---|
| 2009/0006914 A1* | 1/2009 | Ko | G11C 29/38 714/719 |
| 2010/0050029 A1* | 2/2010 | Kemmerling | G01R 31/31926 714/724 |
| 2010/0128540 A1* | 5/2010 | Kim | G11C 29/44 365/194 |
| 2010/0235694 A1* | 9/2010 | Fujisaki | G11C 29/56008 714/719 |
| 2010/0318864 A1* | 12/2010 | Funatsu | G01R 31/318566 714/E11.155 |
| 2019/0311776 A1* | 10/2019 | Yamada | G11C 29/36 |

* cited by examiner

| CKE | TM | DREF | A-node | B-node | OUTA0 |
|---|---|---|---|---|---|
| 0 | 1(En) | CR | EXDATA | RDATA | X |
| 1 | 1(En) | 1(pass) | EXDATA | RDATA | Judge |
| 1 | 1(En) | 0(Fail) | 1 | 1 | 1(pass) |
| 1 | 0(Dis) | 1(pass) | EXDATA | RDATA | Judge |
| 1 | 0(Dis) | 0(Fail) | EXDATA | RDATA | Judge |

TEST CIRCUIT, SEMICONDUCTOR DEVICE AND TEST SYSTEM INCLUDING THE TEST CIRCUIT

CROSS-REFERENCES TO RELATED APPLICATION

The present application claims priority under 35 U.S.C. § 119(a) to Korean application number 10-2019-0104610, filed on Aug. 26, 2019, in the Korean Intellectual Property Office, which is incorporated herein by reference in its entirety.

BACKGROUND

1. Technical Field

Various embodiments may generally relate to a semiconductor circuit, and more particularly, to a test circuit, a semiconductor device and a test system including the test circuit.

2. Related Art

Various tests may be performed on a semiconductor device. The various tests may include a test with respect to a memory region. The test of the memory region may be performed before and after mounting the semiconductor device on a package substrate.

Memory cells in the semiconductor device may be determined to be normal in the test before mounting the semiconductor device. However, when a temporary defect, not a permanent defect, is be generated at the memory cell due to environments, the memory cell may be determined to be abnormal in the test after mounting the semiconductor device.

When the test is be performed using absolute criteria, a screen capacity may be improved. However, the memory cell, which may be temporarily determined to be abnormal due to an insufficient test margin, may be over-screened as a fail so that a test yield may be decreased.

SUMMARY

In some embodiments of the present disclosure, a test circuit may include a comparator and a comparison control circuit. The comparator may be configured to compare a first input signal with a second input signal to generate a comparison result signal. The comparison control circuit may be configured to perform at least one of an operation for latching the comparison result signal as reference data and an operation for outputting the comparison result signal as a first output signal. The comparison control circuit may be configured to provide expectation data as the first input signal and read data as the second input signal in accordance with the reference data.

In some embodiments of the present disclosure, a semiconductor device may include a read path, a write path, an expectation data generation circuit and a test circuit. The read path may include circuits configured to transmit read data outputted from a memory region to an input/output terminal. The write path may include circuits configured to transmit write data inputted through the input/output terminal to the memory region. The expectation data generation circuit may be configured to perform an operation for generating expectation data using the write data and/or an operation for autonomously generating the expectation data without an external input. The test circuit may be configured to compare the expectation data with the read data, which may correspond to a first address in a test unit, to generate the reference data. The test circuit may be configured to compare the expectation data with the read data, which may correspond to next addresses after the first address, in accordance with the reference data to generate a test result signal.

In some embodiments of the present disclosure, a test system may include a semiconductor device and a tester. The semiconductor device may include a memory region configured to output read data. The semiconductor device may be configured to compare expectation data with the read data, which may correspond to a first address in a test unit of the memory region, to generate reference data. The semiconductor device may be configured to compare the expectation data with the read data, which may correspond to next addresses after the first address, in accordance with the reference data to generate a test result signal. The tester may be configured to provide the semiconductor device with the first address for generating the reference data under a first test condition in which a temporary fail determination may be generated. The tester may be configured to perform path/fail determinations in accordance with the test result signal.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Example embodiments may involve a test circuit capable of improving a test yield. Some embodiments may be directed to a semiconductor device including the above-mentioned test circuit. Other embodiments may provide a test system including the above-mentioned test circuit.

Figure 1:
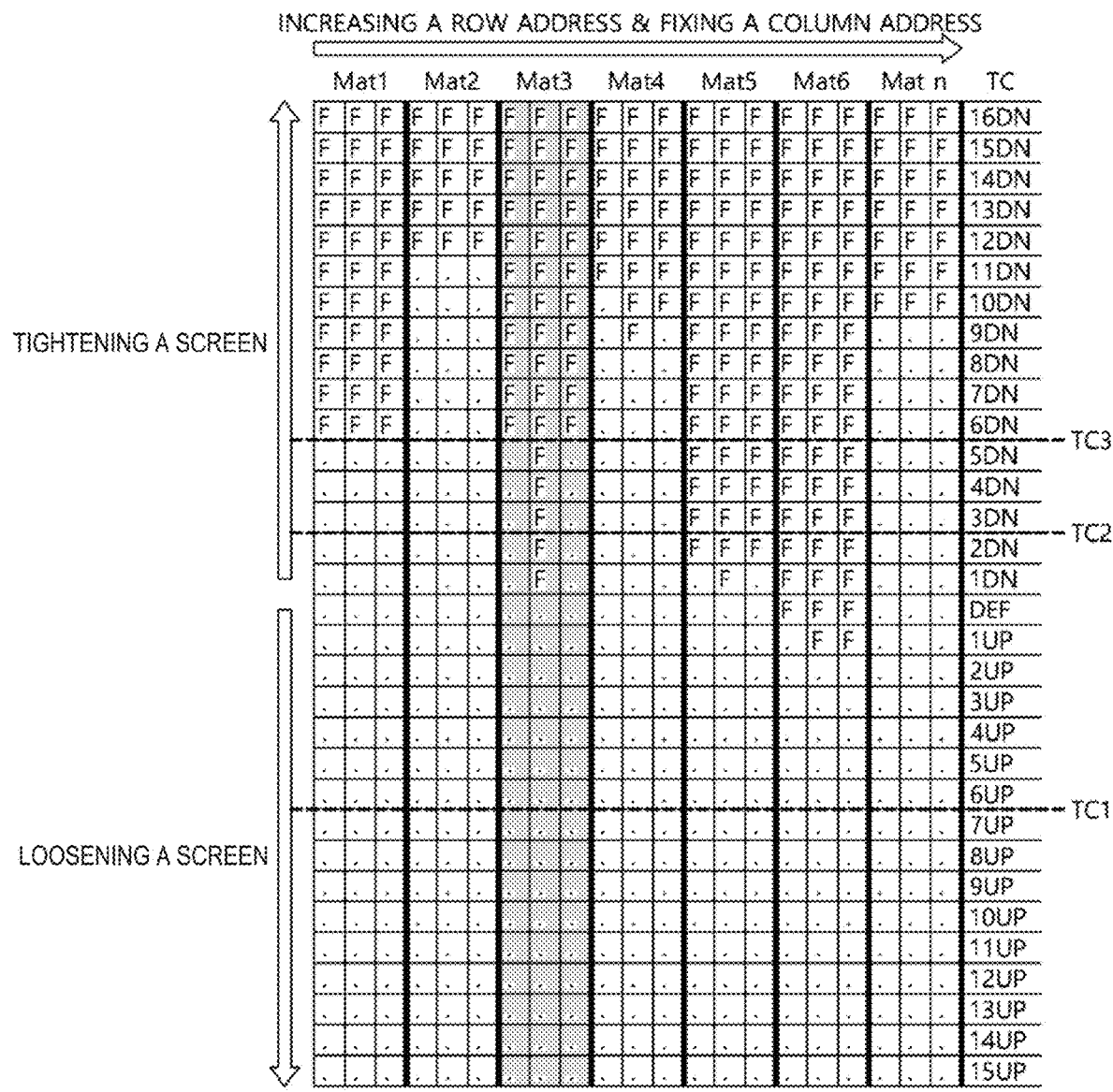
FIG. 1 is a view illustrating an operational concept in accordance with example embodiments.

FIG. 1 is a view illustrating an operational concept in accordance with example embodiments.

Referring to FIG. 1, a memory region of a semiconductor device may include a plurality of unit regions, for example, Mats Mat1-Matn.

Tests may be performed on the memory region in various test conditions. For example, the test conditions may include a bit line pre-charge voltage VBLP.

When the bit line pre-charge voltage VBLP may be increased by fifteen steps more than a default value (DEF), the test condition TC may be 15UP. When the bit line pre-charge voltage VBLP may be decreased by sixteen steps less than the DEF, the test condition TC may be 16DN.

When the test condition TC may be a TC1(6UP), all of the memory cells in Mat1-Matn may be determined to be a pass.

When the test condition TC may be changed into a TC2(3DN) so as to tighten up a screen condition, i.e., a detection criteria of a fail determination, the memory cells (designated "F" in drawings) determined to be a fail in the Mat3, Mat5, and Mat6 may be generated.

When the test condition TC may be changed into the TC3(6DN) so as to tighten up the screen condition, the memory cells F determined to be a fail may be increased.

In the Mat3, a specific memory cell may be determined to be the fail due to tightening of the screen condition. Memory cells adjacent to the specific memory cell may also be determined to be the fail.

The fail determination of the Mat3 may be increased in accordance with mounting conditions, for example, a decrease of an operational margin of a sense amplifier configured to read data in a corresponding memory cell. Thus, the Mat3 may be normally operated in accordance with changes of the mounting conditions.

When the test may be performed in accordance with absolute criteria, a screen capacity may be increased. However, an over-screen may be generated to determine the memory cells, which may be to be normally operated, to be the fail.

Therefore, the test may be performed in accordance with relative criteria, not the absolute criteria, generated by test units to improve a test yield. Because the temporary fail determination may be caused by the decrease of the operational margin of the sense amplifier, the test units may be set by the memory cells connected with a same bit line to exclude the fail determination due to the decrease of the operational margin of the sense amplifier. Alternatively, the test units may be set by the memory cells connected with a same bit line in the Mat.

Figure 2:
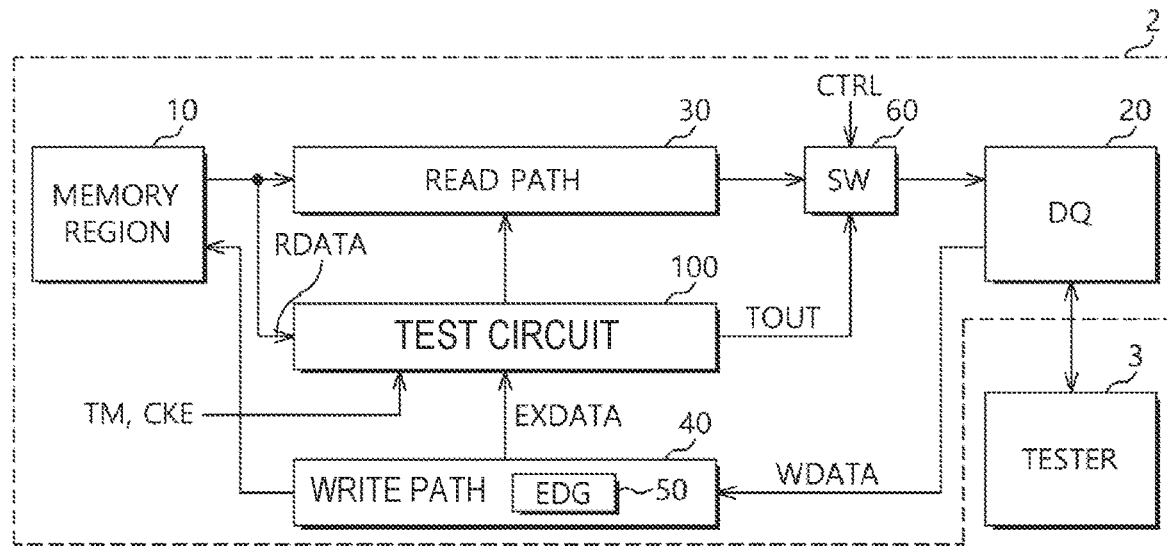
FIG. 2 is a view illustrating a test system in accordance with example embodiments.

FIG. 2 is a view illustrating a test system in accordance with the example embodiments.

Referring to FIG. 2, a test system 1 of this example embodiment may include a semiconductor device 2 and a tester 3.

The semiconductor device 2 may include a memory region 10, an input/output terminal 20, a read path 30, a write path 40, an expectation data generation (EDG) circuit 50, a switching circuit (SW) 60, and a test circuit 100.

The memory region 10 may include the unit memory blocks illustrated with reference to FIG. 1, and circuits configured to write and read data into/from the unit memory blocks.

The input/output terminal 20 may include input/output pads DQ.

The read path 30 may include circuits configured to transmit read data outputted from the memory region in accordance with a read command to the input/output terminal 20.

The write path 40 may include circuits configured to transmit write data inputted through the input/output terminal 20 from an external device in accordance with a write command to the memory region 10.

The expectation data generation circuit 50 may be configured to perform an operation for generating expectation data EXDATA using the write data and/or an operation for autonomously generation the expectation data EXDATA without an external input.

The expectation data generation circuit 50 may be included in the write path 40, not restricted within the above-mentioned position.

The test circuit 100 may be configured to compare the expectation data EXDATA with a read data RDATA corresponding to a first address in a corresponding test unit to generate reference data. The test circuit 100 may be configured to generate a test result signal TOUT according to the reference data by comparing the expectation data EXDATA with read data corresponding to next addresses after the first address.

The test circuit 100 may generate the test result signal TOUT in accordance with the expectation data EXDATA, the read data RDATA, a test mode TM, and a clock enable signal CKE.

The switching circuit 60 may be configured to connect the read path 30 or the test circuit 100 with the input/output terminal 20 in accordance with a control signal CTRL.

The control signal CTRL may have different values in accordance with operational modes of the semiconductor device 2.

In a test mode of the semiconductor device 2, the switching circuit 60 may connect the test circuit 100 with the input/output terminal 20 in accordance with the control signal CTRL.

In a normal operation mode of the semiconductor device 2, the switching circuit 60 may connect the read path 30 with the input/output terminal 20 in accordance with the control signal CTRL.

The tester 3 may be configured to perform a series of control operations for testing the semiconductor device 2.

The control operations performed by the tester 3 may include an operation for providing a write data WDATA, a write command and a corresponding address to generate the expectation data EXDATA, an operation for providing a read command and a corresponding address to generate the read data RDATA, an operation for adjusting the test conditions such as a voltage, and an operation for controlling the test mode signal TM, and the clock enable signal CKE to generate the reference data used in the test circuit 100 of the semiconductor device 2.

Figure 3:
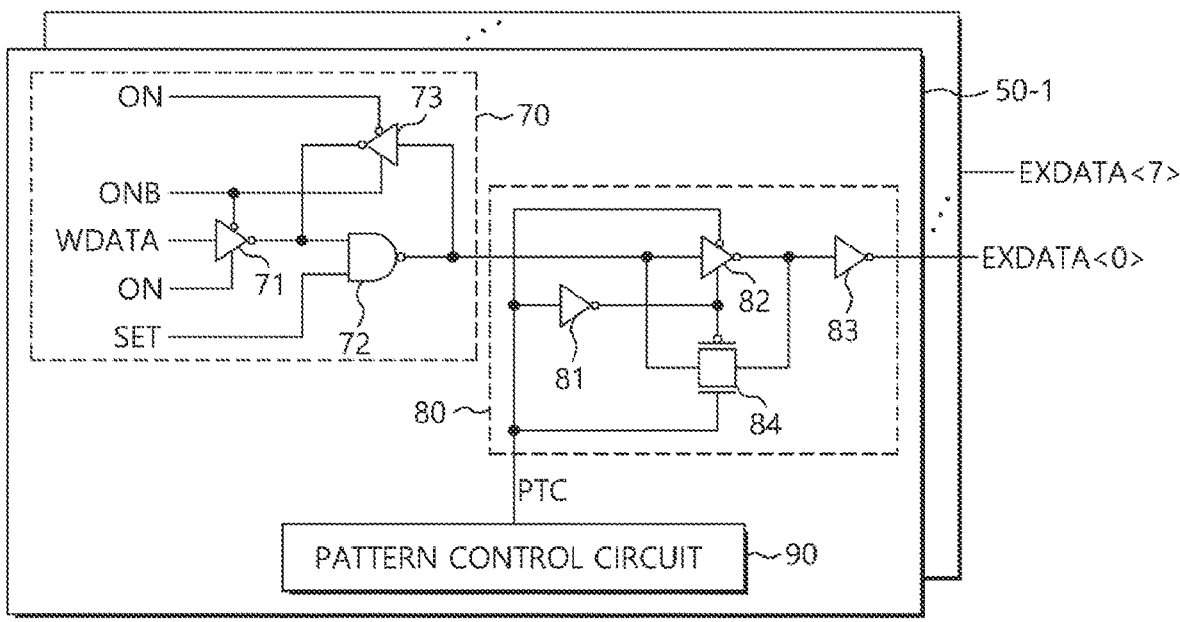
FIG. 3 is a view illustrating an expectation data generation circuit in FIG. 2.

FIG. 3 is a view illustrating an expectation data generation circuit in FIG. 2.

Referring to FIG. 3, the expectation data generation circuit 50 may include a plurality of expectation data generation units 50-1.

Each of the expectation data generation units 50-1 may include substantially the same configuration.

Any one of the expectation data generation units 50-1, for example, an expectation data generation unit 50-1 configured to generate an expectation data EXDATA<0> may include an input latch 70, an output latch 80 and a pattern control circuit 90.

The input latch 70 may be configured to latch and output the write data WDATA in accordance with latch control signals SET, ON and ONB, or to output a signal having a predetermined level.

The output latch 80 may be configured to generate the expectation data EXDAT<0> in accordance with a pattern control signal PTC and an output signal from the input latch 70.

The pattern control circuit 90 may be configured to generate the pattern control signal PTC for controlling a pattern of the expectation data EXDATA<0>.

The input latch 70 may include a first logic gate 71, a second logic gate 72, and a third logic gate 73.

The first logic gate 71 may be configured to invert and output the write data WDATA in accordance with the latch control signals ON and ONB.

The second logic gate 72 may be configured to invert and output an output signal from the first logic gate 71 in accordance with the latch control signal SET.

The third logic gate 73 may be configured to latch an output signal from the second logic gate 72 in accordance with the latch control signals ON and ONB.

The SET among the latch control signals may be used for determining whether the write data WDATA may be referred to as the expectation data EXDATA<0> or not. The ON and the ONB may be used for controlling input and latch operations of the write data WDATA.

The output latch 80 may include a first logic gate 81, a second logic gate 82, a third logic gate 83, and a fourth logic gate 84.

The first logic gate 81 may be configured to invert and output the pattern control signal PTC.

The second logic gate 82 may be configured to invert and output an output signal from the input latch 70 in accordance with the pattern control signal PTC and an output signal from the first logic gate 81.

The third logic gate 83 may be configured to invert an output signal from the second logic gate 82 to output the expectation data EXDATA<0>.

The fourth logic gate 84 may be configured to transmit the output signal from the input latch 70 to an input terminal of the third logic gate 83 in accordance with the pattern control signal PTC and an output signal from the first logic gate 81.

Figure 4:
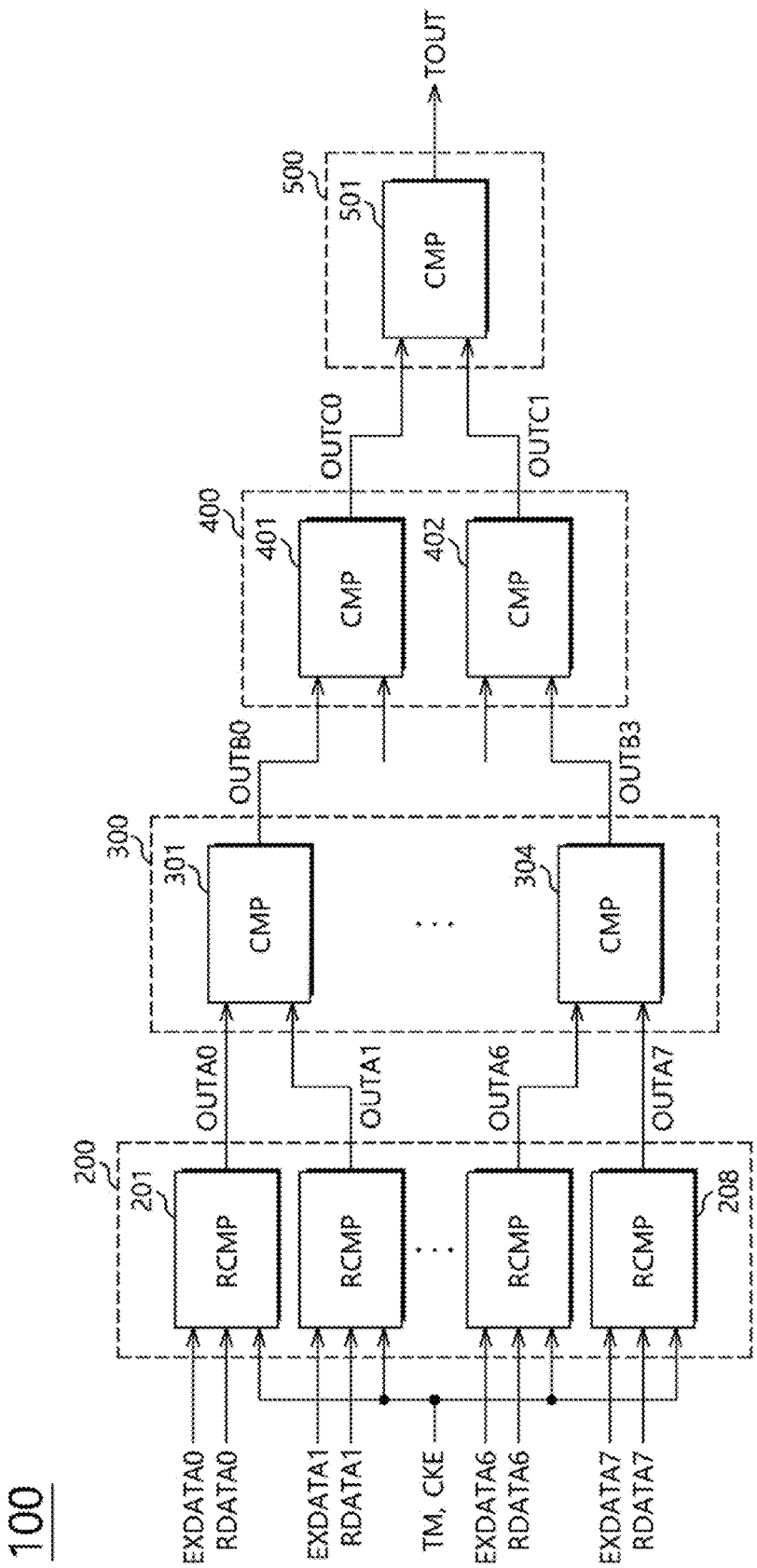
FIG. 4 is a view illustrating a test circuit in accordance with example embodiments.

FIG. 4 is a view illustrating a test circuit in accordance with example embodiments.

Referring to FIG. 4, the test circuit 100 may include a reference variable comparison circuit 200 and a plurality of comparator arrays 300-500.

The comparator arrays 300-500 may be configured to sequentially compare output signals from the reference variable comparator 200 with each other to output a test result signal TOUT.

The comparator arrays 300-500 may have different configurations in accordance with bit numbers of tested data.

In example embodiments, for example, 8 bits of data may be tested. The comparator arrays 300-500 may be classified as a secondary comparator 300, a tertiary comparator 400, and a quaternary comparator 500.

The reference variable comparison circuit 200 may be configured to compare an expectation data EXDATA<0:7> with read data RDATA<0:7> corresponding to a first address in a corresponding test unit to generate the reference data.

Further, the reference variable comparator 200 may be configured to compare the expectation data EXDATA<0:7> with read data RDATA<0:7> corresponding to next addresses after the first address in accordance with the reference data to output first output signals OUTA<0:7>.

The reference variable comparison circuit 200 may generate the first output signals OUTA<0:7> in accordance with the expectation data EXDATA<0:7>, the read data RDATA<0:7>, the test mode signal TM and the clock enable signal CKE.

The reference variable comparison circuit 200 may include a plurality of reference variable comparators 201-208. The reference variable comparators 201-208 may have substantially the same configuration.

The secondary comparator 300 may be configured to compare the first output signals OUTA<0:7> with each other to generate second output signals OUTB<0:3>.

The secondary comparator 300 may include a plurality of comparators 301-304.

The tertiary comparator 400 may be configured to compare the second output signals OUTB<0:3> with each other to generate third output signals OUTC<0:1>.

The tertiary comparator 400 may include a plurality of comparators 401 and 402.

The quaternary comparator 500 may be configured to compare the third output signals OUTC<0:1> with each other to output the test result signal TOUT.

The quaternary comparator 500 may include a comparator 501.

The comparators 301-304 of the secondary comparator 300, the comparators 401 and 402 of the tertiary comparator 400 and the comparator 501 of the quaternary comparator 500 may have substantially the same configuration.

Figures 5, 6:
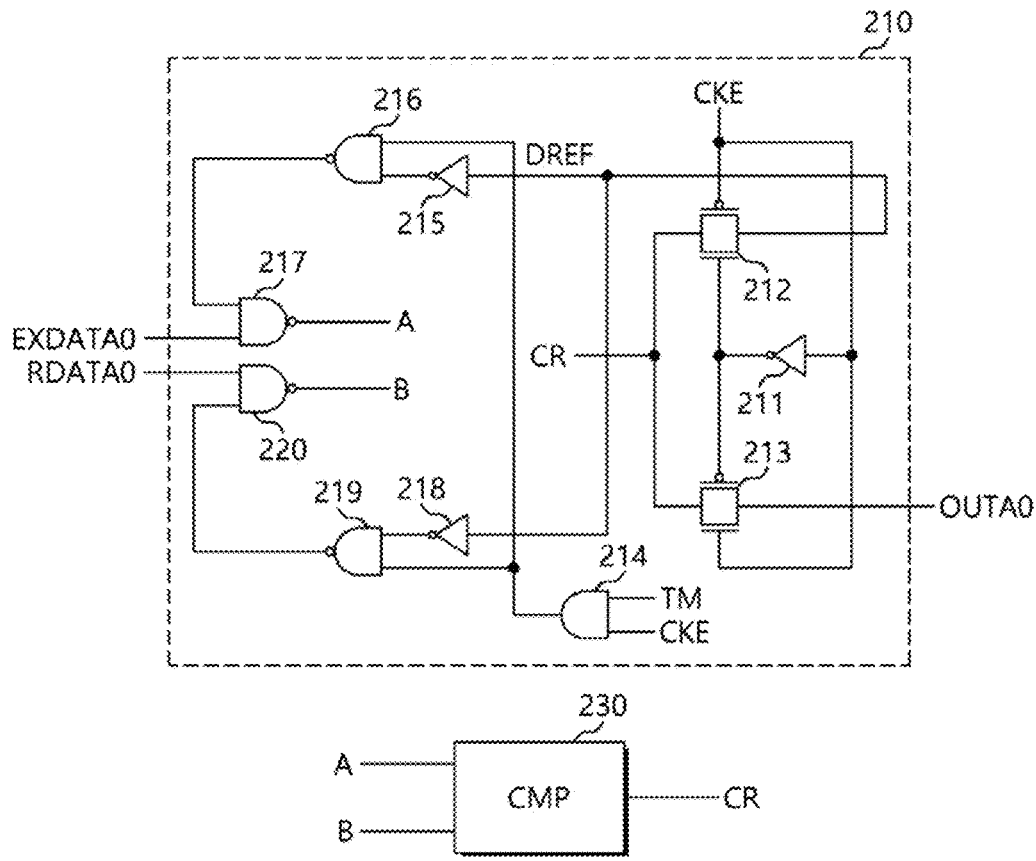
FIG. 5 is a view illustrating a reference variable comparator in FIG. 4.
FIG. 6 is a truth table illustrating an operation of the reference variable comparator in FIG. 5.

FIG. 5 is a view illustrating a reference variable comparator in FIG. 4, and FIG. 6 is a truth table illustrating an operation of the reference variable comparator in FIG. 5.

Referring to FIG. 5, the reference variable comparator 201 may include a comparison control circuit 210 and a comparator 230.

The comparator 230 may be configured to compare a first input signal A with a second input signal B to generate a comparison result signal CR.

When the first input signal A may be substantially the same as the second input signal B, the comparator 230 may output the comparison result signal CR having a high level. In contrast, when the first input signal A may be different from the second input signal B, the comparator 230 may output the comparison result signal CR having a low level.

For example, the comparator 230 may include an XNOR gate.

The comparator 230 may have a configuration substantially the same as that of the comparators 301-304, 401-402 and 501.

The comparison control circuit 210 may be configured to perform at least one of an operation for latching the comparison result signal CR as reference data DREF in accordance with the test mode signal TM and the clock enable signal CKE and an operation for outputting the comparison result signal CR as a first output signal OUTA0.

The comparison control circuit 210 may provide expectation data EXDATA0 as the first input signal A and read data RDATA as the second input signal B in accordance with values of the reference data DREF.

The comparison control circuit 210 may include first to tenth logic gate 211-220.

The first logic gate 211 may be configured to invert and output the clock enable signal CKE.

The second logic gate 212 may be configured to latch the comparison result signal CR as the reference data DREF in accordance with the clock enable signal CKE and an output signal from the first logic gate 211.

The third logic gate 213 may be configured to output the comparison result signal CR as the first output signal OUTA0 in accordance with the clock enable signal CKE and the output signal from the first logic gate 211.

The fourth logic gate 214 may perform a logic AND operation of the test mode signal TM and the clock enable signal CKE to output a signal.

The fifth logic gate 215 may be configured to invert and output the reference data DREF.

The sixth logic gate 216 may perform a logic NAND operation of output signal from the fourth logic gate 214 and the fifth logic gate 215 to output a signal.

The seventh logic gate 217 may perform a logic NAND operation of an output signal from the sixth logic gate 216 and the expectation data EXDATA0 to generate the first input signal A.

The eighth logic gate 218 may be configured to invert and output the reference data DREF.

The ninth logic gate 219 may perform a logic NAND operation of output signals from the fourth logic gate 214 and the eighth logic gate 218 to output a signal.

The tenth logic gate 220 may perform a logic NAND operation of an output signal from the ninth logic gate 219 and the read data RDATA0 to generate the second input signal B.

Referring to FIG. 6, when the clock enable signal CKE may be a low level and the test mode signal TM may be a high level, the sixth logic gate 216 and the ninth logic gate 219 may output a signal having a high level, respectively. Thus, the comparison result signal CR may be latched as the reference data DREF through the second logic gate 212.

When the clock enable signal CKE and the test mode signal TM may be a high level and the reference data DREF may be a pass determination level (for example, a high level), the sixth logic gate 216 and the ninth logic gate 219 may output the signal having the high level. Thus, the comparison result signal CR generated by comparing the expectation data EXDATA0 with the read data RDATA0 may be outputted as the first output signal A through the third logic gate 213.

When the clock enable signal CKE and the test mode signal TM may be a high level and the reference data DREF may be a fail determination level (for example, a low level), the sixth logic gate 216 and the ninth logic gate 219 may output a signal having a low level. Thus, the comparison result signal CR of the path determination level (for example, a high level) regardless of the expectation data EXDATA0 and the read data RDATA0 may be outputted as the first output signal A through the third logic gate 213.

When the clock enable signal CKE may be a high level and the test mode signal TM may be a low level, the sixth logic gate 216 and the ninth logic gate 219 may output a signal having a high level. Thus, the comparison result signal CR generated by comparing the expectation data EXDATA0 with the read data RDATA0 regardless of the reference data DREF may be outputted as the first output signal A.

Hereinafter, a test method of the test system 1 in accordance with example embodiments may be illustrated in detail with reference to FIGS. 1 to 6.

The tester 3 may provide the semiconductor device 2 with the write data WDATA, the write command and the address for the test to perform the test data write operation.

The expectation data generation circuit 50 of the semiconductor device 2 may generate the expectation data EXDATA in accordance with the write data WDATA.

The write data WDATA provided from the tester 3 may have a predetermined value between the semiconductor device 2 and the tester 3. Thus, as mentioned above with reference to FIG. 3, the expectation data generation circuit 50 of the semiconductor device 2 may generate the expectation data EXDATA having a value substantially the same as that of the write data WDATA regardless of the write data WDATA, i.e., not using the write data WDATA.

After performing the test data write operation, the tester 3 may provide the semiconductor device 2 with the read command and the address to perform the test data read operation. Thus, the read data RDATA may be outputted. Further, the semiconductor device 2 may generate the reference data DREF and output the test result.

When the first address (X=0, Y=0, X is a row address, and Y is a column address) in the test unit may be provided to the semiconductor device 2 during the test data read operation, the tester 3 may generate the test mode signal TM having a high level and the clock enable signal CKE having a low level.

When the first address (X=0 and Y=0) may be provided to the semiconductor device 2, the tester 3 may set the test condition, for example, a 10DN for tightening up the screening to generate the temporary fail determination (See FIG. 1). Thus, the test circuit 100 may generate and store the relative condition, not the absolute condition, i.e., the reference data DREF.

Referring to FIG. 5, because the clock enable signal CKE may have the low level, the reference variable comparator 201 may store the comparison result signal CR, which may be generated by comparing the expectation data EXDATA0 with the read data RDATA0, as the reference data DREF, not output the comparison result signal CR to the external device.

When the addresses (for example, X=1-767 and Y=0) after the first address in the corresponding test unit, for example, the Mat1 may be provided to the semiconductor device 2, the tester 3 may generate the test mode signal TM having a high level and the clock enable signal CKE having a high level.

When the addresses (for example, X=1-767 and Y=0) after the first address may be provided to the semiconductor device 2, the tester 3 may adjust the test condition, for example, 8DN. That is, the test condition may be loosed compared when the test circuit 100 may generate the reference data DREF.

Referring to FIG. 5, because the test mode signal TM and the clock enable signal CKE may have the high level, the reference variable comparator 201 may output the comparison result signal, which may be generated by comparing the expectation data EXDATA0 with the read data RDATA0 in accordance with the reference data DREF, as the first output signal OUTA0.

The tester 3 may repeat the above-mentioned test operation control with increasing the column address. The tester 3 may repeatedly perform the test operation control on the Mat2-Matn. Alternatively, the tester 3 may repeat the above-mentioned test operation control with decreasing the column address.

When the reference data DREF may be '1' (pass), a comparison result of the expectation data EXDATA0 and the read data RDATA0 may be outputted as the first output signal OUTA0 so that the tester 3 may judge.

When the reference data DREF may be '0' (fail), the addresses (for example, X=1-767 and Y=0) after the first address, which may commonly share a bit line with the first address, may be determined to be the fail by comparing the expectation data EXDATA0 with the read data RDATA0. However, because the fail determination may correspond to the temporary fail determination, the fail by the tester 3 might not be determined. Thus, the first input signal A and the second input signal B may be outputted as '1' regardless of the values of the expectation data EXDATA0 and the read data RDATA0 to output the first output signal OUTA0 having '1.'

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Another additions, subtractions, or modifications are obvious in view of the present disclosure and are intended to fall within the scope of the appended claims.

What is claimed is:

1. A test circuit comprising:
   a comparator configured to compare a first input signal with a second input signal to generate a comparison result signal; and
   a comparison control circuit configured to perform at least one of an operation for latching the comparison result signal as reference data and an operation for outputting the comparison result signal as a first output signal,
   wherein the comparison control circuit is configured to provide expectation data as the first input signal and read data as the second input signal in accordance with the reference data, and
   wherein the comparison control circuit is configured to output the first output signal as a pass determination level regardless of the expectation data and the read data when the reference data has a fail determination level.

2. The test circuit of claim 1, wherein the comparison control circuit is configured to provide the expectation data as the first input signal and the read data as the second input signal when the reference data has a pass determination level.

3. The test circuit of claim 1, wherein the comparison control circuit is configured to latch the comparison result signal as the reference data when a clock enable signal has a first level.

4. The test circuit of claim 3, wherein the comparison control circuit is configured to output the comparison result signal as the first output signal when the clock enable signal has a second level.

5. A semiconductor device comprising:
   a read path including circuits configured to transmit read data outputted from a memory region to an input/output terminal;
   a write path including circuits configured to transmit write data inputted through the input/output terminal to the memory region;
   an expectation data generation circuit configured to perform at least one of an operation for generating expectation data using the write data and an operation for autonomously generating the expectation data without an external input; and
   a test circuit configured to compare the expectation data with the read data corresponding to a first address in a test unit to generate the reference data, and to compare the expectation data with the read data corresponding to next addresses after the first address in accordance with the reference data to generate a test result signal,
   wherein the test circuit is configured to output the first output signal having a pass determination level regardless of the expectation data and the read data when the reference data has a fail determination level.

6. The semiconductor device of claim 5, wherein the test circuit comprises:
   a reference variable comparison circuit; and
   a plurality of comparator arrays configured to sequentially compare output signals of the reference variable comparison circuit with each other to generate the test result signal,
   wherein the reference variable comparison circuit comprises a plurality of reference variable comparators,
   wherein each of the reference variable comparators comprises:
   a comparator configured to compare a first input signal with a second input signal to generate a comparison result signal; and
   a comparison control circuit configured to perform at least one of an operation for latching the comparison result signal as the reference data and an operation for outputting the comparison result signal as a first output signal, and
   wherein the comparison control circuit is configured to provide the expectation data as the first input signal and the read data as the second input signal in accordance with the reference data.

7. The semiconductor device of claim 6, wherein the comparison control circuit is configured to output the first output signal having the pass determination level regardless of the expectation data and the read data when the reference data has the fail determination level.

8. The semiconductor device of claim 7, wherein the comparison control circuit is configured to provide the expectation data as the first input signal and the read data as the second input signal when the reference data has a pass determination level.

9. The semiconductor device of claim 6, wherein the comparison control circuit is configured to latch the comparison result signal as the reference data when a clock enable signal has a first level.

10. The semiconductor device of claim 9, wherein the comparison control circuit is configured to output the comparison result signal as the first output signal when the clock enable signal has a second level.

11. A test system comprising:
    a semiconductor device including a memory region configured to output read data, the semiconductor device configured to compare expectation data with the read data corresponding to a first address in a test unit of the memory region to generate reference data and to compare the expectation data with the read data corresponding to next addresses after the first address in accordance with the reference data to generate a test result signal; and
    a tester configured to provide the semiconductor device with the first address for generating the reference data under a first test condition where a temporary fail determination is to be generated and to perform pass/fail determinations in accordance with the test result signal,
    wherein the semiconductor device is configured to output the test result signal having a pass determination level regardless of the expectation data and the read data when the reference data has a fail determination level.

12. The test system of claim 11, wherein the test unit of the memory region comprises memory cell arrays configured to commonly share a same bit line in a mat.

13. The test system of claim 11, wherein the semiconductor device is configured to compare the expectation data with the read data corresponding to next addresses after the first address when the reference data has a pass determination level.

14. The test system of claim 11, wherein the semiconductor device comprises:
   a comparator configured to compare a first input signal with a second input signal to generate a comparison result signal; and
   a comparison control circuit configured to perform at least one of an operation for latching the comparison result signal as reference data and an operation for outputting the comparison result signal as a first output signal,
   wherein the comparison control circuit is configured to provide expectation data as the first input signal and read data as the second input signal in accordance with the reference data.

15. The test system of claim 11, wherein the tester provides the semiconductor device with next addresses after the first address under a second test condition having a low probability for generating a temporary fail determination.

* * * * *